(12) United States Patent
Spinelli

(10) Patent No.: US 6,370,168 B1
(45) Date of Patent: Apr. 9, 2002

(54) INTRACAVITY FREQUENCY-CONVERTED OPTICALLY-PUMPED SEMICONDUCTOR LASER

(75) Inventor: Luis A. Spinelli, Sunnyvale, CA (US)

(73) Assignee: Coherent, Inc., Santa Clara, CA (US)

(*) Notice: Subject to any disclaimer, the term of this patent is extended or adjusted under 35 U.S.C. 154(b) by 0 days.

(21) Appl. No.: 09/421,717

(22) Filed: Oct. 20, 1999

(51) Int. Cl.[7] .............................................. H01S 3/10
(52) U.S. Cl. ........................... 372/22; 372/50; 372/93; 372/105; 372/98
(58) Field of Search ............................ 372/70, 71, 21, 372/75, 93, 97, 98, 105, 36, 22, 50

(56) References Cited

U.S. PATENT DOCUMENTS

| 5,050,179 A | 9/1991 | Mooradian | 372/44 |
|---|---|---|---|
| 5,131,002 A | 7/1992 | Mooradian | 372/50 |
| 5,289,485 A | 2/1994 | Mooradian | 372/45 |
| 5,461,637 A | 10/1995 | Mooradian et al. | 372/92 |
| 5,627,853 A | 5/1997 | Mooradian et al. | 372/92 |
| 5,768,302 A * | 6/1998 | Wallace et al. | 372/21 |
| 6,097,742 A * | 8/2000 | Caprara et al. | 372/22 |
| 6,167,068 A * | 12/2000 | Caprara et al. | 372/22 |

FOREIGN PATENT DOCUMENTS

| EP | 0 563 779 | 3/1993 | H01S/3/109 |
|---|---|---|---|
| EP | 0 576 197 | 6/1993 | H01S/3/109 |
| WO | WO 92/14542 | 7/1993 | H01S/3/109 |
| WO | WO 98/43329 | 10/1998 | H01S/3/085 |
| WO | WO 00/25398 | 5/2000 | H01S/5/024 |

OTHER PUBLICATIONS

Walker, D.R., "Kilohertz All–solid–state Picosecond Lithium Triborate Optical Parametric Generator", Optics Letters, vol. 20, No. 2, Jan. 15, 1995., pp. 145–147.*

Petrov, V., "Tunable femtosecond Optical Parametric Amplifier in the Mid–infrared with Narrow–band Seeding", Journal of Optical Society of America., vo. 12, No. 11, Nov. 1995, pp. 2214–2221.*

W. Xiang et al., "Femtosecond external–cavity surface–emitting InGaAs/InP multiple–quantum–well laser," *Optics Letters*, vol. 16, No. 18, Sep. 15, 1991, pp. 1394–1396.

J.V. Sandusky & S.R.J. Brueck, "A CW External–Cavity Surface–Emitting Laser," *IEEE Photonics Technology Letters*, vol. 8, No. 3, Mar. 1996, pp. 313–315.

(List continued on next page.)

*Primary Examiner*—James W. Davie
*Assistant Examiner*—Davienne Monbleau
(74) *Attorney, Agent, or Firm*—Stallman & Pollock LLP

(57) ABSTRACT

An intracavity, frequency-doubled, external-cavity, optically-pumped semiconductor laser in accordance with the present invention includes a semiconductor multilayer surface-emitting gain-structure surmounting a Bragg mirror. An external concave mirror and the Bragg-mirror define a stable laser-resonator including the gain-structure. A birefringent filter is located in the resonator, inclined at an angle to the resonator axis, for selecting a fundamental frequency of the laser-radiation within a gain bandwidth characteristic of semiconductor structure. An optically-nonlinear crystal is located in the laser-resonator between the birefringent filter and the gain-structure and arranged to double the selected frequency of laser-radiation. The gain-structure is coated with a dichroic coating which reflects the frequency-doubled radiation and transmits the fundamental radiation and optical pump-light. A surface of the birefringent filter facing the gain-structure includes a dichroic coating which reflects the frequency-doubled radiation and transmits the fundamental radiation. Frequency-doubled radiation generated on both forward and reverse passes of fundamental laser-radiation through the optically-nonlinear crystal is coupled out of the resonator by the dichroic coated birefringent filter.

34 Claims, 2 Drawing Sheets

OTHER PUBLICATIONS

M. Kuznetsov, F. Hakimi, R. Sprague & A. Mooradian, "High–Power (>0.5–W CW) Diode–Pumped Vertical–External–Cavity Surface–Emitting Semiconductor Lasers with Circular $TEM_{00}$ Beams," *IEEE Photonics Technology Letters,* vol. 9, No. 8, Aug. 1997, pp. 1063–1065.

A. Rosiewicz, P. Crosby & J–M. Pelaprat, "Optical pumping improves VCSEL performance," *Laser Focus World,* Jun. 1997, p. 133–136.

W.J. Alford, T.D. Raymond, M.H. Crawford and A.A. Allerman, "Intracavity frequency doubling of an optically-–pumped, external–cavity surface–emitting semiconductor laser," Advanced Solid State Laser Conference, Sandia National Laboratories, SAND–98–2108C, CONF–990105, Dec. 31, 1998, 5 pages in length.

U.S. Patent Application No. 09/179,022, filed Oct. 26, 1998, entitled "Intracavity Frequency–Converted Optically–Pumped Semiconductor Laser".

U.S. Patent Application No. 09/263,325, filed Mar. 5, 1999, entitled "High–Power External–Cavity Optically–Pumped Semiconductor Lasers".

* cited by examiner

INTRACAVITY FREQUENCY-CONVERTED OPTICALLY-PUMPED SEMICONDUCTOR LASER

TECHNICAL FIELD OF THE INVENTION

The present invention relates in general to external-cavity semiconductor lasers. It relates in particular to optically-pumped, intracavity (IC) frequency-doubled, semiconductor lasers.

DISCUSSION OF BACKGROUND ART

Intracavity doubled semiconductor lasers are known in the prior art in two classes. One class is based on edge-emitting semiconductor lasers (diode-lasers), the other on vertical-cavity surface-emitting lasers (VCSEL), electrically-energized. In each class, in order to conveniently effect intracavity doubling, the resonant-cavity of the semiconductor laser must be extended beyond the semiconductor device, leaving free space in which an optically-nonlinear crystal can be located to effect frequency-doubling. This is usually effected by providing an antireflection coating on the emitting surface of the semiconductor laser (which would otherwise serve as an output coupling mirror) and by providing an external-mirror, spaced apart from that surface, to serve the same purpose. Such an arrangement is usually referred to as an external-cavity semiconductor laser.

The efficiency of frequency-conversion in an optically-nonlinear crystal is directly proportional to power (intensity) of the fundamental frequency incident on the crystal. This is the case whether conversion is doubling to a second harmonic frequency, frequency mixing to provide third or higher odd harmonic frequencies, or optical parametric oscillation (OPO). Because of this, for example, for a useful IC-doubling, a high power (about 200 milliwatts (mW) or greater) semiconductor laser is essentially a prerequisite. Unfortunately, in both classes of semiconductor laser which have been used in the prior-art for this purpose, increasing power comes at the expense of decreasing beam-quality.

An edge-emitting semiconductor laser, for example, is inherently a high-gain device, as laser light resonates in the plane of the layers forming its active or gain region. As the height (thickness) of these gain-region layers is constrained by electrical confinement and optical confinement considerations, output power must be increased by increasing the width of the gain-region. As the width of the gain-region is increased (to as much as one-hundred times its height in high-power devices), more modes can oscillate, and the output beam becomes highly astigmatic. Accordingly, design of an adequate resonator, for coupling light into an optically-nonlinear crystal therein, as well as for general beam-quality, becomes increasingly more difficult, if not impossible.

A VCSEL is inherently a relatively low gain device, as laser-radiation resonates perpendicular to the plane of the layers forming its active or gain-region. For a relatively small beam diameter, for example about 5 micrometer ($\mu$m) or less, single-mode operation and high beam-quality can be achieved. Gain and output power can be improved in part by increasing the number of active layers in the gain medium. This is somewhat limited by considerations of the properties of materials forming the semiconductor structure. For a further increase in power, however, the area of the emitting surface must be increased. Increasing the emitting surface area to a diameter greater than about 5 $\mu$m inevitably leads, initially, to multimode operation. Further increasing the diameter leads to problems in energizing the laser, as electrical pumping must be supplied laterally. In order to do this uniformly and efficiently, the electrical resistance of semiconductor layers forming the laser must be decreased by increased doping. Increased doping, however, reduces the light transmission of the layers and increases resonator loss, such that the purpose of increased doping quickly becomes self-defeating.

There is a need for an intracavity frequency-converted external-cavity semiconductor laser that can provide high, frequency-converted output power together with high beam-quality.

The general structure of this type of laser is set forth in U.S. patent application Ser. No. 09/179,022, filed Oct. 26, 1998, the disclosure of which is incorporated herein by reference. The subject invention represents a specific commercial embodiment of such a device.

Additional information about designing and fabricating high power lasers of this type can be found in U.S. patent application Ser. No. 09/263,325, filed Mar. 5, 1999, the disclosure of which is herein incorporated by reference.

SUMMARY OF THE INVENTION

In one aspect, a laser in accordance with the present invention comprises an OPS-structure including a multilayer gain-structure surmounting a multilayer mirror-structure. The gain-structure includes a plurality of active layers spaced apart by spacer layers. A laser-resonator is formed between the mirror structure of the OPS-structure and an external mirror spaced apart from the OPS-structure. A pump-light source is arranged to deliver pump-light to the gain-structure for generating laser-radiation in the laser-resonator. A transmissive wavelength-selective element is located in the laser-resonator for selecting a frequency of the laser-radiation within a gain-bandwidth characteristic of the composition of the gain-structure. An optically-nonlinear crystal is located in the laser-resonator between the transmissive wavelength-selective element and the optically-nonlinear crystal and is arranged to double the selected frequency of laser-radiation, thereby providing frequency-doubled radiation. A first dichroic filter is disposed between the gain-structure and the optically-nonlinear crystal. The first dichroic filter is at normal incidence to the resonator axis and is arranged to reflect frequency-doubled radiation incident thereon and direct the frequency-doubled radiation toward a second dichroic filter. The second dichroic filter is located between the transmissive wavelength-selective element and the optically-nonlinear crystal, and is inclined at an angle to the resonator axis. The second dichroic filter is arranged to reflect frequency-doubled radiation directed thereto by the first dichroic filter out of the laser-resonator as output radiation.

The transmissive wavelength-selective element is preferably a birefringent filter. Use of another transmissive wavelength-selective element such as an etalon, however, is not precluded.

Preferably, the first dichroic filter is in the form of a coating on the gain-structure and the second dichroic filter is in the form of a coating on a surface of the transmissive wavelength-selective element facing the optically-nonlinear crystal. This arrangement of dichroic filters avoids resonator losses due to polarization rotation of fundamental laser-radiation which could occur were the filters coated on separate substrates. This arrangement also provides that frequency-doubled radiation does not pass through any optical elements other than the optically-nonlinear crystal in which the frequency-doubled radiation is generated. This maximizes the output of frequency-doubled radiation.

In one example of the inventive laser having this particular arrangement of dichroic filters, the gain-structure has active layers of indium gallium arsenide with a composition selected to provide laser-radiation at a wavelength of about 976 nanometers (nm). The gain-structure is optically pumped by 2 Watts (W) of focussed light from an edge-emitting diode-laser, the pump-light having a wavelength of about 808 nm. The birefringent filter is a crystal quartz plate inclined at about 57° to the resonator axis. The optically nonlinear crystal is crystal of LBO (lithium tri-borate $LiB_3O_5$). The external mirror is a concave mirror having a radius of curvature of 5.0 millimeters (mm) spaced apart by a distance of about 4.3 mm from the OPS-structure. The laser delivers between about 20 and 60 milliwatts (mW) of frequency-doubled (488 nm) radiation in a single axial mode.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the invention.

DETAILED DESCRIPTION OF THE INVENTION

Figure 1:
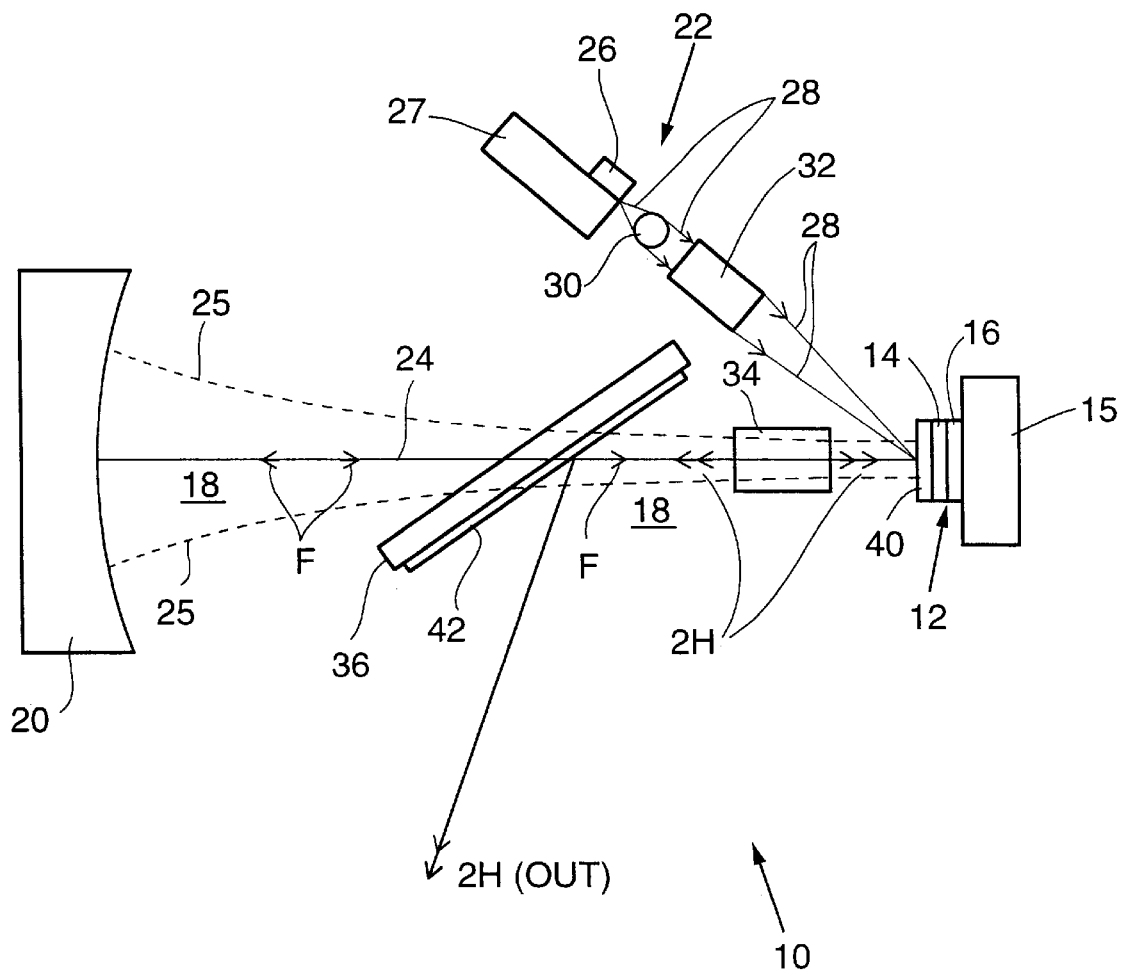
FIG. 1 schematically illustrates one preferred embodiment of an optically-pumped, semiconductor laser in accordance with the present invention, having laser-resonator including a surface-emitting gain-structure, an optically-nonlinear crystal arranged for frequency doubling a fundamental wavelength of laser-radiation emitted by the gain-structure and a wavelength-selective element used for selecting the fundamental wavelength, the wavelength selective element and the gain-structure each having a dichroic-filter thereon for reflecting frequency-doubled radiation.

Turning now to the drawings, FIG. 1 depicts one preferred embodiment 10 of an optically-pumped IC-doubled external vertical cavity laser in accordance with the present invention, hereinafter referred to simply as OPS-laser 10. Laser 10 includes an optically-pumped semiconductor laser structure (OPS-structure) 12 including an epitaxially-grown monolithic semiconductor (surface-emitting) gain-structure 14 including a plurality of active layers (not shown) spaced apart by separator-layers (not shown). OPS-structure 12 is in thermal contact with a substrate or heat-sink 15.

Gain-structure 14, on being optically pumped, emits laser-radiation in a narrow spectrum of wavelengths, generally defined as a gain-bandwidth of the gain-structure. The gain-bandwidth has a nominal (median) characteristic (fundamental) emission wavelength and corresponding characteristic emission frequency which is dependent, inter alia, on the composition of the active layers. By way of example, for active layers of an In GaAs composition emitting at a wavelength of about 976 nanometers (nm) the spectrum of wavelengths has a full width at half maximum emission (FWHM) of about 30 nm.

It should be noted here that the term separator-layers in the context of this description and the appended claims applies to one or more layers separating the active layers. At least one such layer absorbs optical pump-radiation. Depending on the composition of that layer, one or more other layers may be included for strain compensation. Such arrangements are well known in the semiconductor laser art, and any such arrangement is applicable in the context of the present invention.

OPS-structure 12 also includes a mirror-structure 16 which serves as one end-mirror (a plane mirror) for a laser-resonator 18. Another mirror 20, preferably a concave mirror, provides the other end-mirror of laser-resonator 18. Gain-structure 14 of OPS-structure 12 is thereby incorporated in laser-resonator 18. Mirror structure 16 and mirror 20 are highly reflective (for example have a reflectivity of about 99% or greater) for the fundamental wavelength of gain-structure 14.

A pump-radiation source 22 is arranged to deliver pump-radiation to gain-structure 14 of OPS-structure 12, for generating laser-radiation in laser-resonator 18. Fundamental radiation so generated circulates in laser-resonator 18 generally along resonator axis 24, as indicated by single arrow-heads F. Pump-radiation source 22 includes an edge-emitting semiconductor diode-laser 26 or an array of such lasers mounted on a heat sink 27. Other pump-light sources, coherent or non-coherent, may be used without departing from the spirit and scope of the present invention. Pump-light 28 exits diode-laser 26 as a divergent beam and is focussed onto OPS-structure 12 by a cylindrical microlens 30 and a radial-gradient-index lens (a SELFOC lens) 32. One or more additional pump-light sources may be deployed to direct additional pump-radiation onto OPS-structure 12. The pump-light focussing arrangement of lenses 30 and 32 is but one preferred arrangement for focussing pump-light. Those skilled in the art may devise other focussing arrangements without departing from the spirit and scope of the present invention. Those skilled in the art will further recognize, without further illustration, that light from diode-laser 26 may be collected and transported to a suitable focussing arrangement by an optical waveguide or optical-fiber array.

An optically-nonlinear crystal 34 is located in laser-resonator 18 and arranged to double a predetermined frequency of fundamental laser-radiation selected from a spectrum of such frequencies defined by the gain-bandwidth. As noted above, the gain-bandwidth is characteristic of the composition of active layers of gain-structure 14. The axial path of frequency-doubled (second-harmonic) radiation is indicated in FIG. 1 by double arrows 2H.

A birefringent filter 36 is located laser-resonator 18 for selecting the predetermined frequency of the laser-radiation. The birefringent filter is inclined at an angle (preferably Brewster's angle for the material of the filter) to resonator axis 24. While a birefringent filter is preferred for this purpose, another transmissive wavelength-selective element such as an etalon (preferably uncoated) may be used in place of birefringent filter 18. One purpose of birefringent filter 36 (or a similar wavelength-selective element) is to provide that fundamental laser-radiation always has the same frequency, despite manufacturing variations in the semiconductor multilayer structure. Inclusion of the birefringent filter is also advantageous for the following reason.

An optically-nonlinear crystal is typically arranged to frequency-double one particular frequency at any instant. As the doubling process constitutes a loss in the laser-resonator, given a gain medium of sufficient gain bandwidth, the resonator will attempt to oscillate at a frequency other than the frequency to be doubled (so-called "wavelength hopping") in order to avoid the loss. The result of this is uncontrolled modulation or noise, if not outright loss of frequency-doubled output. Inclusion of birefringent filter 36 forces laser-resonator 18 to resonate only at the selected frequency to be doubled, thereby forcing frequency-doubling and eliminating noise due to wavelength-hopping.

One suitable stable resonator configuration for laser-resonator 18 is formed when mirror 20 has a radius of curvature slightly greater (for example, about 20%) than the optical length of resonator of laser-resonator 18. As gain-structure 14 is positioned adjacent mirror-structure 16 the resonator will inherently operate in a single axial (longitudinal) mode. Single-axial-mode operation not only provides high beam-quality, but precludes output-noise phenomena characteristic of uncontrolled multimode operation such as mode-coupling, and sum-frequency generation in an optically-nonlinear crystal. The mode-shape is indicated in FIG. 1 by dotted lines 25. It has a widest portion adjacent mirror 20 and is focussed by the mirror to a narrowest portion or beam waist adjacent OPS-structure 12. Optically-nonlinear crystal 34 is preferably placed in this narrowest portion or beam waist adjacent OPS-structure 12, as, here, the intensity of fundamental radiation is highest, thereby providing optimum frequency-doubling. It should be noted here that the above-exemplified specifications for the curvature of mirror 20 and resonator length should not be considered limiting. Those skilled in the art will recognize that the relative dimensions of mirror curvature and resonator length in such a stable resonator configuration depend, inter alia, on the resonator length, which is usually selected to provide a certain mode-size in the resonator.

Particularly important features of the inventive OPS-laser 10 are multilayer optical coatings 40 and 42 on respectively OPS-structure 12 and birefringent filter 36. Optical coating 40 is highly reflective for second-harmonic radiation 2H and highly transmissive for fundamental laser-radiation F and pump-light 28. Optical coating 40 minimizes absorption of second-harmonic radiation in OPS-structure 12 and reflects this second-harmonic radiation back along axis 24 toward birefringent filter 36.

Optical coating 42 on the surface of birefringent filter 36 facing OPS-structure 12 is highly reflective for second-harmonic radiation 2H (in the s-state of polarization for type-I phase matching in optically-nonlinear crystal 34) and highly transmissive for fundamental laser-radiation F in the p-state of polarization. Those skilled in the art will recognize that these specifications for coating 42 are for the angle of incidence of radiation on the birefringent filter, which is about 57° for a filter made from crystal quartz. This coating directs second-harmonic radiation 2H out of laser-resonator 18 as output radiation 2H(OUT) and prevents significant loss of the 2H-radiation in the birefringent filter.

Optical coatings 40 and 42 are preferably multilayer-dielectric, dichroic coatings of a type often referred to by practitioners of the art as long-wavelength-pass dichroic filters. The design and manufacture of suitable coatings is within the capabilities of commercial suppliers of optical coating services, for example, Coherent Auburn Group, of Auburn, Calif.

The above-described arrangement of optical coatings provides for a relatively simple, straight laser-resonator which allows for optimum placement of optically-nonlinear crystal 34, and allows delivery from the laser-resonator of second-harmonic radiation generated on both forward and reverse passes of fundamental radiation through the optically-nonlinear crystal. Further, the second-harmonic radiation does not pass through any optical component other than the optically-nonlinear crystal in which it is generated, thereby maximizing output of frequency-doubled output.

Figure 2:
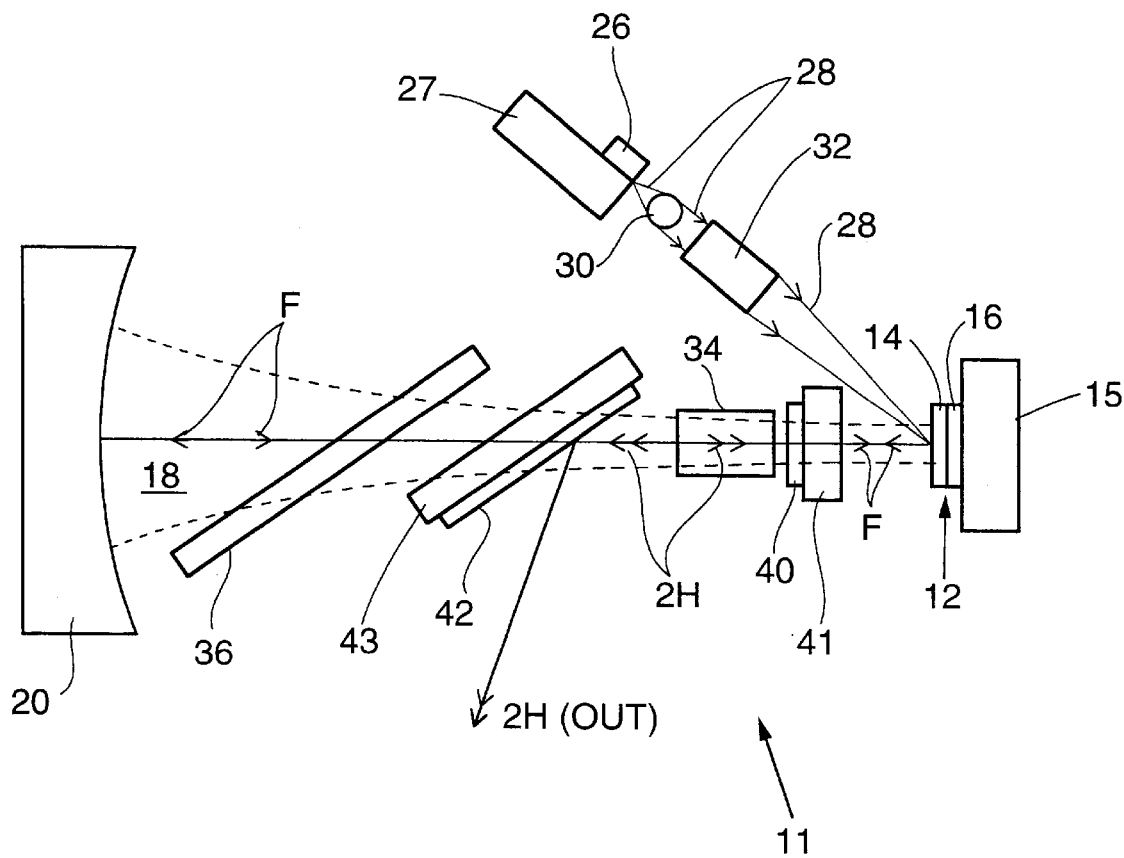
FIG. 2 schematically illustrates another preferred embodiment of an optically-pumped, semiconductor laser in accordance with the present invention, similar to the laser of FIG. 1 but wherein the dichroic-filters are on separate substrates.

Those skilled in the art will recognize that, in principle at least, coatings 40 and 42 could be applied on separate substrates. This is illustrated in FIG. 2, which depicts another embodiment 11 of a laser in accordance with the present invention. Here, coating 42 is supported by a suitably-inclined transparent substrate 43 located between birefringent filter 36 and optically-nonlinear crystal 34. Coating 40 is supported on a separate substrate 41 at normal incidence to axis 24 and located between OPS-structure 12 and optically-nonlinear crystal 34. For this reason, coatings 40 and 42 may be considered as independent, dichroic filters. In the arrangement of FIG. 2 inclination of the wavelength selective-element 36 to resonator axis may not be a requirement depending on the type of element selected. The arrangement of coatings 40 and 42 in FIG. 1 is preferred because any degree of stress birefringence in separate substrates would cause rotation of the plane of polarization of fundamental radiation which could lead to a loss of fundamental radiation at birefringent filter 36.

In one example of a laser 10 in accordance with the arrangement of FIG. 1, OPS-structure 12 has a gain-structure 14 comprising fifteen QW or active-layers of an $In_{0.18}Ga_{0.82}As$ composition, having a thickness of about 75.0 Angstrom Units (Å) providing a nominal fundamental (emission) wavelength of 976 nm. Between the QW layers are pump-light-absorbing (separator) layers of a $GaAs_{0.978}P_{0.022}$ composition having a thickness of 1217 Å. Between the QW layers and the separator layers is a strain-relieving layer of GaAs having a thickness of about 50 Å. Mirror-structure 16 comprises 27 pairs or periods of alternating layers of GaAs having a refractive index of about 3.51 and $AlAs_{0.96}P_{0.04}$ having a refractive index of about 2.94 and an optical thickness of one-quarter wavelength at the fundamental-wavelength. Gain-structure 14 also includes a carrier-confinement layer of $Ga_{0.51}In_{0.49}P$, having a thickness of 1588 Å, between the last separator layer and mirror-structure 16. At an opposite extremity of gain-structure 34 there is also a carrier-confinement layer of $Ga_{0.51}In_{0.49}P$ having a thickness of 1588 Å.

OPS-structure 12 is epitaxially grown on an n-type GaAs wafer (substrate), gain-structure 34 being grown first, beginning with the carrier confinement layer. Mirror-structure 30 is epitaxially-grown on the gain-structure. After the OPS-structure is grown, the wafer is etched away. The first-grown confinement layer serves as an etch-stop layer when the substrate is removed by etching. The wafer, and structures grown thereon, is diced into several OPS-structures 12 in the form of square "chips" about 2.0 millimeters (mm) by 2.0 mm.

A chip (an OPS-structure 12) is then bonded using a gold-tin solder onto a heat sink 15 made from a copper-tungsten alloy (composite material) of a composition selected such that its coefficient of expansion matches the coefficient of expansion of gallium arsenide. Such a copper-tungsten alloy is available from the Brush Wellman Corporation of Cleveland, Ohio. Optical coating 40 is deposited on OPS-structure 12 after the OPS-structure is bonded to the heat sink.

Pump-light source 22 delivers about 2.0 Watts (W) of pump power at a wavelength of about 808 nm to gain-structure 14 of OPS-structure 12. Birefringent filter 36 is arranged to select fundamental radiation of 976 nm. Optically-nonlinear crystal 34 is an LBO crystal 5.0 mm long, 3 mm×3 mm in cross-section and arranged for type-I phase matching. It should be noted here that while LBO is a preferred optically-linear crystal that any other optically-nonlinear crystal, for example, potassium niobate (KNbO$_3$) or potassium titanyl phosphate (KTP) may be used without departing from the spirit and scope of the present invention.

Birefringent filter 36 is quartz plate having a thickness of 2.0 mm and oriented as depicted in FIG. 1 at 57.1 degrees to axis 24, with the quartz optical axis in the plane of the plate. Fundamental radiation is polarized by birefringent filter 36 in a direction parallel to the plane of incidence thereof.

Mirror 20 is a concave mirror having a radius of curvature of 50.0 mm. Mirror 20 is coated for high reflectivity at the fundamental wavelength. OPS-structure 12 is located at about 43.0 mm from mirror 20. This laser-resonator arrangement provides a beam waist adjacent OPS structure 12. Optically-nonlinear crystal 34 is located proximate OPS-structure 12 in a position which coincides with about the minimum diameter of the beam waist (see dotted lines 25). The beam waist is about 80 μm in diameter at the 1/e$^2$ points. In this example of laser 10, an output of between about 20 and 60 mW at a wavelength of about 488 nm is obtained.

It should be noted here that an IC-doubled OPS-laser in accordance with the present invention is not limited to use with materials of the gain-structure exemplified above. From the description of the inventive OPS-laser provided above, those skilled in the art may select other OPS-structures for providing fundamental-radiation at wavelengths between about 425 nm and 1800 nm without departing from the spirit and scope of the present invention. Such structures may include, by way of example, active layers selected from a group of semiconductor compounds consisting of, $In_xGa_{1-x}As_yP_{1-y}$, $Al_xGa_{1-x}As_yP_{1-y}$, and $In_xGa_{1-x}N$ where $0.0 \leq x \leq 1.0$ and $0 \leq y \leq 1$. This list, however, should not be considered as limiting the present invention. Frequency-doubled or second harmonic (2H) wavelengths, of course, would be between about 212 and 900 nm.

The present invention has been described and depicted in terms of a preferred and other embodiments. The invention is not limited, however, to the embodiments described and depicted. Rather, the invention is defined by the claims appended hereto.

What is claimed is:

1. A laser, comprising:
   an OPS-structure including a multilayer gain-structure surmounting a multilayer mirror-structure, said gain-structure including a plurality of active layers spaced apart by spacer layers;
   a straight laser-resonator having a resonator axis, said laser-resonator formed between said mirror structure of said OPS structure and a mirror spaced apart from said gain-structure;
   a pump-light source arranged to deliver pump-radiation to said gain-structure for generating laser-radiation in said laser-resonator;
   a transmissive wavelength-selective element located in said laser-resonator for selecting a frequency of said laser-radiation within a gain bandwidth characteristic of the composition of said gain-structure;
   an optically-nonlinear crystal located in said laser-resonator between said transmissive wavelength-selective element and said gain-structure and arranged to double said selected frequency of laser-radiation, thereby providing frequency-doubled radiation; and
   first and second dichroic filters, said first dichroic filter disposed between said gain-structure and said optically-nonlinear crystal at normal incidence to said resonator axis and arranged to reflect frequency-doubled radiation incident thereon and direct said frequency-doubled radiation away from said gain structure, through said optically nonlinear crystal toward said second dichroic filter, said second dichroic filter being located between said transmissive wavelength-selective element and said optically-nonlinear crystal and being inclined at an angle to said resonator axis and arranged to reflect frequency-doubled radiation out of said laser-resonator as output radiation.

2. The laser of claim 1, wherein said transmissive wavelength-selective element is a birefringent filter.

3. The laser of claim 2, wherein said birefringent filter is inclined to said resonator axis at about Brewster's angle for the material of the birefringent filter.

4. The laser of claim 1, wherein said transmissive wavelength-selective element is an etalon.

5. The laser of claim 1, wherein said first dichroic filter is coated on said gain-structure.

6. The laser of claim 1, wherein said second dichroic filter is coated on a surface of said transmissive wavelength-selective element facing said optically-nonlinear crystal.

7. The laser of claim 1, wherein said first dichroic filter is coated on a substrate located between said gain-structure and said optically-nonlinear crystal.

8. The laser of claim 1, wherein said second dichroic filter is coated on a surface of a substrate located between said transmissive wavelength-selective element and said optically-nonlinear crystal.

9. The laser of claim 1, wherein said external mirror is a concave mirror having a radius of curvature greater than the optical length of said laser-resonator.

10. The laser of claim 9, wherein said laser-radiation has a mode-shape which is widest at said external mirror and narrowest proximate said OPS-structure and wherein said optically-nonlinear crystal is located at about said narrowest portion of said mode-shape.

11. The laser of claim 1, wherein said laser-radiation is in a single axial mode of said laser-resonator.

12. The laser of claim 1, wherein said active layers of said gain-structure are layers of a semiconductor material selected from the group of semiconductor materials consisting of $In_xGa_{1-x}As_yP_{1-y}$, $Al_xGa_{1-x}As_yP_{1-y}$, and $In_xGa_{1-x}N$ where $0.0 \leq x \leq 1.0$ and $0 \leq y \leq 1$.

13. The laser of claim 12, wherein said fundamental radiation has a wavelength between about 1800 and 425 nanometers.

14. The laser of claim 13, wherein said active layers of said gain-structure are layers of a semiconductor material having a composition $In_{0.18}Ga_{0.82}As$ and said wavelength of fundamental radiation is 976 nm.

15. The laser of claim 1, wherein said dichroic filters are transmissive at the wavelength selected by the wavelength selected element.

16. A laser, comprising:
   an OPS-structure including a multilayer gain-structure surmounting a multilayer mirror-structure, said gain-structure including a plurality of active layers spaced apart by spacer layers said active layers being layers of an indium gallium arsenide composition having a composition selected such that said active layers have a characteristic emission wavelength for laser-radiation in the region of 976 nanometers;
   a straight laser-resonator having a resonator axis, said laser-resonator formed between said mirror structure of said OPS structure and a concave mirror spaced-apart from said OPS structure;

a pump-light source arranged to deliver pump-radiation to said gain-structure for generating laser-radiation having said characteristic emission wavelength in said laser-resonator;

a birefringent filter located in said laser-resonator for maintaining said laser-radiation at said characteristic emission wavelength, said birefringent filter inclined at an angle to said resonator axis;

an optically-nonlinear crystal located in said laser-resonator between said birefringent filter said gain-structure and arranged to double the frequency of said characteristic emission wavelength of laser-radiation, thereby providing frequency-doubled radiation having a wavelength of about 488 nanometers; and first and second dichroic filters, configured to have high reflectivity at about 488 nanometers, said first dichroic filter being in the form of a coating on said gain-structure arranged to reflect said frequency doubled radiation incident thereon away from said gain-structure, through said optically nonlinear crystal toward said second dichroic filter, and said second dichroic filter being in the form of a coating on a surface of said birefringent filter facing said optically-nonlinear crystal and arranged to reflect frequency-doubled radiation out of said laser-resonator as output radiation.

17. The laser of claim 16, wherein said OPS-structure is in thermal contact with a heat-sink, said heat-sink being of a material having a thermal expansion coefficient which matches the thermal expansion coefficient of gallium arsenide.

18. The laser of claim 17, wherein said heat-sink material is a copper-tungsten material.

19. The laser of claim 16, wherein said optically-nonlinear crystal is an LBO crystal.

20. The laser of claim 16, wherein said concave mirror is spaced apart from said OPS-structure by a distance less than the radius of curvature of said concave mirror.

21. The laser of claim 20, wherein said birefringent filter is in the form of a crystal quartz plate inclined to said resonator axis at an angle of about 57 degrees.

22. The laser of claim 16, wherein said dichroic filters are highly transmissive at 976 nanometers.

23. A laser, comprising:

a straight laser resonator formed between two opposed mirrors;

an OPS-structure located in said resonator, said OPS structure including a multilayer gain-structure have a plurality of active layers spaced apart by spacer layers;

a pump-light source arranged to deliver pump-radiation to said gain-structure for generating fundamental laser-radiation in said laser-resonator;

a transmissive wavelength-selective element located in said laser-resonator for selecting a frequency of said fundamental laser-radiation within a gain bandwidth characteristic of the composition of said gain-structure;

an optically-nonlinear crystal located in said laser-resonator between said transmissive wavelength-selective element and said gain-structure and arranged to double said selected frequency of laser-radiation, thereby providing frequency-doubled radiation; and first and second dichroic filters configured to reflect the frequency doubled radiation and transmit the fundamental radiation, said first dichroic filter disposed between said gain-structure and said optically-nonlinear crystal and arranged to reflect said frequency doubled radiation away from said gain-structure, through said optically-nonlinear crystal toward said second dichroic filter, said second dichroic filter being located between said transmissive wavelength-selective element and said optically-nonlinear crystal and being inclined at an angle to said resonator axis and arranged to reflect frequency-doubled radiation out of said laser-resonator as output radiation.

24. The laser of claim 23, wherein said transmissive wavelength-selective element is a birefringent filter.

25. The laser of claim 24, wherein said birefringent filter is inclined to said resonator axis at about Brewster's angle for the material of the birefringent filter.

26. The laser of claim 25, wherein said second dichroic filter is coated on a surface of said birefringent filter facing said optically-nonlinear crystal.

27. The laser of claim 26, wherein said first dichroic filter is coated on said gain-structure.

28. The laser of claim 27 wherein one of said mirrors of said laser is a multilayer mirror structure formed with said OPS-structure.

29. The laser of claim 28, wherein said external mirror is a concave mirror having a radius of curvature greater than the optical length of said laser-resonator.

30. The laser of claim 29, wherein said laser-radiation has a mode-shape which is widest at said external mirror and narrowest proximate said OPS-structure and wherein said optically-nonlinear crystal is located at about said narrowest portion of said mode-shape.

31. The laser of claim 30, wherein said laser-radiation is in a single axial mode of said laser-resonator.

32. The laser of claim 27, wherein said active layers of said gain-structure are layers of a semiconductor material selected from the group of semiconductor materials consisting of $In_xGa_{1-x}As_yP_{1-y}$, $Al_xGa_{1-x}As_yP_{1-y}$, and $In_xGa_{1-x}N$ where $0.0 \leq x \leq 1.0$ and $0 \leq y \leq 1$.

33. The laser of claim 32, wherein said fundamental radiation has a wavelength between about 1800 and 425 nanometers.

34. The laser of claim 33, wherein said active layers of said gain-structure are layers of a semiconductor material having a composition $In_{0.18}Ga_{0.82}As$ and said wavelength of fundamental radiation is 976 nm.

* * * * *